(12) United States Patent
Huang et al.

(10) Patent No.: US 11,410,833 B2
(45) Date of Patent: Aug. 9, 2022

(54) LOWER ELECTRODE MECHANISM AND REACTION CHAMBER

(71) Applicant: BEIJING NAURA MICROELECTRONICS EQUIPMENT CO., LTD., Beijing (CN)

(72) Inventors: Yahui Huang, Beijing (CN); Gang Wei, Beijing (CN); Yicheng Li, Beijing (CN); Xingfei Mao, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 111 days.

(21) Appl. No.: 16/624,246

(22) PCT Filed: Nov. 15, 2017

(86) PCT No.: PCT/CN2017/111125
§ 371 (c)(1),
(2) Date: Dec. 18, 2019

(87) PCT Pub. No.: WO2018/233192
PCT Pub. Date: Dec. 27, 2018

(65) Prior Publication Data
US 2020/0321198 A1    Oct. 8, 2020

(30) Foreign Application Priority Data

Jun. 19, 2017    (CN) .......................... 201710464985.7

(51) Int. Cl.
*H01J 37/32*    (2006.01)

(52) U.S. Cl.
CPC ...... *H01J 37/32568* (2013.01); *H01J 37/321* (2013.01); *H01J 37/32651* (2013.01);
(Continued)

(58) Field of Classification Search
CPC ................ C23C 16/4586; H01J 37/321; H01J 37/32568; H01J 37/32651;
(Continued)

(56) References Cited

U.S. PATENT DOCUMENTS

| 6,395,095 | B1 * | 5/2002 | Jones | ..................... H01J 37/321 |
| | | | | 118/728 |
| 7,981,218 | B2 * | 7/2011 | Yamashita | .............. C23C 16/46 |
| | | | | 118/725 |

(Continued)

FOREIGN PATENT DOCUMENTS

| CN | 1849033 A | 10/2006 |
| CN | 103337444 A | 10/2013 |

(Continued)

OTHER PUBLICATIONS

The World Intellectual Property Organization (WIPO) International Search Report for PCT/CN2017/111125 dated Mar. 23, 2018 3 Pages.

*Primary Examiner* — Benjamin Kendall
(74) *Attorney, Agent, or Firm* — Anova Law Group PLLC

(57) ABSTRACT

The present disclosure provides a lower electrode mechanism and a reaction chamber, the lower electrode mechanism includes a base for carrying a workpiece to be processed and a lower electrode chamber disposed under the base, the lower electrode chamber includes an electromagnetic shielding space and a non-electromagnetic shielding space isolated from each other, the chamber of the lower electrode chamber includes a first through hole and a second through hole, and the electromagnetic shielding space and the non-electromagnetic shielding space are respectively connected to outside through the first through hole and the second through hole to prevent a plurality of first components disposed in the electromagnetic shielding space from (Continued)

being interfered by a second component disposed in the non-electromagnetic shielding space.

24 Claims, 7 Drawing Sheets

(52) U.S. Cl.
CPC . *H01J 37/32715* (2013.01); *H01J 2237/0266* (2013.01); *H01J 2237/334* (2013.01)

(58) Field of Classification Search
CPC ........... H01J 37/32715; H01J 37/32724; H01J 2237/0266; H01J 2237/334; H01L 21/68785; H01L 21/68792
See application file for complete search history.

(56) References Cited

U.S. PATENT DOCUMENTS

| | | |
|---|---|---|
| 9,673,062 B1 | 6/2017 | Okumura |
| 2003/0051665 A1* | 3/2003 | Zhao .................. C23C 16/5096 118/723 E |
| 2005/0022736 A1* | 2/2005 | Steger .................. H01J 37/321 118/715 |
| 2005/0066902 A1* | 3/2005 | Fink .................. H01J 37/32082 118/729 |
| 2012/0033340 A1* | 2/2012 | Roy .................. H01L 21/67109 361/234 |
| 2013/0128409 A1* | 5/2013 | Nam .................. H01J 37/32091 361/234 |

FOREIGN PATENT DOCUMENTS

| | | |
|---|---|---|
| CN | 104167343 A | 11/2014 |
| CN | 105632967 A | 6/2016 |
| CN | 106158717 A | 11/2016 |
| CN | 106816397 A | 6/2017 |
| CN | 107093545 A | 8/2017 |
| CN | 207074639 U | 3/2018 |
| JP | H09167762 A | 6/1997 |
| JP | 2002208584 A | 7/2002 |
| JP | 2011222931 A | 11/2011 |
| KR | 100629065 B1 | 9/2006 |

\* cited by examiner

LOWER ELECTRODE MECHANISM AND REACTION CHAMBER

This application is a National Stage entry under § 371 of International Application No. PCT/CN2017/111125, filed on Nov. 15, 2017, and claims priority to Chinese Patent Application No. 201710464985.7, filed on Jun. 19, 2017, the entire contents of which are hereby incorporated by reference.

TECHNICAL FIELD

The present disclosure relates to the field of microelectronics technology, and more specifically, to a lower electrode mechanism and a reaction chamber.

BACKGROUND

Inductive coupled plasma (ICP) etching devices are widely used in the field of semiconductor wafer fabrications, especially in the field of silicon etching fabrication.

The conventional ICP device mainly includes an air intake mechanism, an upper electrode mechanism, and a lower electrode mechanism. In particular, the air intake mechanism is used to transport the processing gas into the reaction chamber; the upper electrode mechanism is used to excite the processing gas to form a plasma, and the lower electrode mechanism is used to carry the workpiece to be processed and apply a radio frequency (RF) bias to the workpiece to attract the plasms to etch the surface of the workpiece to be processed.

The lower electrode mechanism includes a base for carrying the workpiece to be processed, and the base may be an electrostatic chuck. In addition, a lower electrode chamber is disposed below the base. The chamber body of the lower electrode chamber and the chamber sidewall of the reaction chamber forms an introduction channel connected to the outside. Conductive members with different functions enter the lower electrode chamber through the introduction channel to be introduced to the bottom of the base through a mounting plate disposed at the bottom of the base, and the conductive members may be electrically connected to the base. The conductive members usually include a RF connection pin, a heating wire, an electrostatic adsorption wire, etc. In particular, an outer end of the RF connection pin is connected to a RF source (or. an outer end of the RF connection pin is connected to a RF power supply through a matcher), and an inner end of the RF connection pin runs through the mounting plate from bottom to top and electrically connects to the base. Similar to the RF connection pin, outer ends of the heating wire and the electrostatic adsorption wire respectively connect to an alternating current (AC) power supply and a direct current (DC) power supply, and inner ends of the heating wire and the electrostatic adsorption wire run through the mounting plate from bottom to top and electrically connect to a heating element and DC electrode in the base. In addition, the lower electrode chamber further includes a cooling duct for supplying cooling water to a cooling duct in the base, a back-blowing duct for introducing a back-blowing air into a back-blowing duct in the base, a temperature sensor for detecting the temperature of the base, a thimble mechanism, etc.

In the process of implementing the present disclosure, the Applicants have identified the following problems that are unavoidable in the practical applications of the lower electrode mechanism described above.

First, in the lower electrode mechanism described above, mutual interferences exist between the RF connection pin and other metal parts, which affects the uniformity of the electric field.

Second, the RF connection pin, the mounting plate, and the base are all conductive materials and the three are electrically connected, which causes radio frequency leakage, thereby affecting the radio frequency stability.

SUMMARY

According to an aspect of the present disclosure, a lower electrode mechanism is provided. The lower electrode mechanism includes a base for carrying a workpiece to be processed; a lower electrode chamber disposed under the base including: an electromagnetic shielding space and a non-electromagnetic shielding space isolated from each other, the chamber of the lower electrode chamber includes a first through hole and a second through hole, and the electromagnetic shielding space and the non-electromagnetic shielding space respectively connect to an outside through the first through hole and the second through hole to prevent first components disposed in the electromagnetic shielding space from being interfered by a second component disposed in the non-electromagnetic shielding space.

In some embodiments of the present disclosure, the chamber of the lower electrode chamber includes a chamber body. A first extension portion is formed on one side of the chamber body, and the first through hole and the second through hole are formed and horizontally disposed in the first extension portion.

In some embodiments of the present disclosure, a second extension portion is formed on the other side of the chamber body opposite to the first extension portion, the second extension is symmetrical with the first extension portion with respect to a center line of the base in a radial direction.

In some embodiments of the present disclosure, the lower electrode mechanism further includes a first shielding module, the first shielding module is disposed between an inner end of the first through hole connected to the lower electrode chamber and the base, and is located in the lower electrode chamber to from a first electromagnetic shielding chamber, the first electromagnetic shielding chamber being the electromagnetic shielding space; and a space outside the first electromagnetic shielding chamber in the lower electrode chamber is the non-electromagnetic shielding space.

In some embodiments of the present disclosure, the lower electrode mechanism further includes a first shielding module, the first shielding module is disposed between an inner end of the first through hole connected to the lower electrode chamber and the base, and is located in the lower electrode chamber to from a first electromagnetic shielding chamber, the first electromagnetic shielding chamber being the electromagnetic shielding space; and a space outside the first electromagnetic shielding chamber in the lower electrode chamber is the non-electromagnetic shielding space.

In some embodiments of the present disclosure, the first shielding module includes: a shielding sleeve having an arc shape, one end of which is disposed under the base, and the other end of which is connected to the first through hole to form the first electromagnetic shielding chamber.

In some embodiments of the present disclosure, the base includes a base body and an insulating disk disposed sequentially from top to bottom; the lower electrode mechanism further includes an introduction assembly, the introduction assembly including a first introduction section, a second introduction section, and a third introduction section that are sequentially connected, where the first introduction section is embedded in the insulating disk; the second introduction section is located in the electromagnetic shielding space; and the third introduction section protrudes outside the lower electrode chamber through the first through hole.

In some embodiments of the present disclosure, the first introduction section includes: a radio frequency sleeve, an upper end of which is electrically connected to the base body, a lower end of which extends to a lower surface of the insulating disk and being connected to the second introduction section; a first insulator disposed in the radio frequency sleeve, which includes an upper contact surface being in contact with a lower surface of the base body and a lower contact surface opposite to the second introduction section; and a plurality of first conductive channels formed in the first insulator, each of the first conductive channels extends from the upper contact surface to the lower contact surface, and each of the first components passes through each of the first conductive channels in a one-to-one correspondence.

In some embodiments of the present disclosure, the radio frequency sleeve is a vertically arranged straight cylinder, a connecting barrel having a diameter smaller than the straight cylinder is formed at a top of the straight cylinder, and the connecting barrel is embedded in the base body; a lower end of the straight cylinder extends to the lower surface of the insulating disk and is connected to the second introduction section; the first insulator includes a center portion embedded in the straight cylinder and an outer ring portion disposed around an outer peripheral wall of the straight cylinder, where a lower surface of the center portion is used as the lower contact surface and an upper surface of the outer ring portion is used as the upper contact surface; a first channel is formed in the center form, a second channel is formed in a cylindrical wall of the straight cylinder, and a third channel is formed in the outer ring portion, the first channel, the second channel, and the third channel are connected to form the first conductive channel.

In some embodiments of the present disclosure, the plurality of first conductive channels are disposed in layers in a vertical direction in the first insulator.

In some embodiments of the present disclosure, the plurality of first conductive channels include: at least one first conductive channel corresponding to a heating wire, and at least one first conductive channel corresponding to an electrostatic adsorption wire; and the conductive channel corresponding to the heating wire is located in a lower layer of the conductive channel corresponding to the electrostatic adsorption wire.

In some embodiments of the present disclosure, the radio frequency sleeve is a cone, a diameter of an upper end of the cone is larger than a diameter of a lower end of the cone; the upper end of the cone is electrically connected to the base body, and the lower end of the cone extends to the lower surface of the insulating disk and is connected to the second introduction section; the first insulator is embedded in the cone and conforms to the shape of the cone.

In some embodiments of the present disclosure, the second introduction section includes: a first radio frequency conduit having an arc shape, an upper end of the first radio frequency conduit is connected to the first introduction section, and a lower end of the first radio frequency conduit is connected to the third introduction section; a second insulator, which is disposed in the first radio frequency conduit, and a first end surface of the second insulator is opposite to the first introduction section, a second end surface of the second insulator is opposite to the third introduction section; and a plurality of second conductive channels formed in the second insulator, each of the second conductive channels is disposed along an axis of the first radio frequency conduit, and the second conductive channels extend from the first end surface to the second end surface; each of the first components passes through each of the second conductive channels in a one-to-one correspondence.

In some embodiments of the present disclosure, the third introduction section includes: a second radio frequency conduit, one end of the second radio frequency conduit is connected to the second introduction section, and the other end of the second radio frequency conduit extends horizontally along the axis of the first through hole to the outside of the lower electrode chamber; a third insulator, which is disposed in the second radio frequency conduit, and a first end surface of the third insulator is opposite to the second introduction section; and a plurality of third conductive channels formed in the third insulator, each of the third conductive channels is disposed along an axis of the second radio frequency conduit, and the third conductive channels extend from the first end surface of the third insulator to a second end surface of the third insulator; each of the first components passes through each of the third conductive channels in a one-to-one correspondence and protrudes from the second end surface of the third insulator.

In some embodiments of the present disclosure, a conductive pin is disposed on one end of the second radio frequency conduit corresponding to the second end surface of the third insulator: a fourth channel is disposed in in a sidewall of the second radio frequency conduit between the second end surface of the third insulator and the conductive pin, the first components extending from the second end surface of the third insulator extends outwardly from the fourth channel.

In some embodiments of the present disclosure, the first components includes a plurality of heating wires and at least one electrostatic adsorption wire, in which, the plurality of heating wires are symmetrically distributed around an axis of the electromagnetic shielding space; and the at least one electrostatic adsorption wire is disposed inside the plurality of heating wires.

In some embodiments of the present disclosure, an inner diameter of the electromagnetic shielding space is 2 to 6 times of an outer diameter of the second introduction section.

In some embodiments of the present disclosure, the outer diameter of the second introduction section ranges from 15 to 50 mm.

In some embodiments of the present disclosure, thickness of the insulating disk ranges from 60 to 300 mm.

In some embodiments of the present disclosure, the lower electrode mechanism further includes: at least one first insulating ring, the third introduction section is fixed to an inner wall of the electromagnetic shielding space through the first insulating ring to be isolated from the inner wall of the electromagnetic shielding space; and/or at least one second insulating ring, the third introduction section is fixed to an inner wall of the first through hole through the second insulating ring to be isolated from the inner wall of the first through hole.

According to another aspect of the present disclosure, a reaction chamber is further provided, and any of the lower electrode mechanisms described above is provided in the reaction chamber.

In some embodiments of the present disclosure, the lower electrode mechanism is connected to the reaction chamber, a third through hole and a fourth through hole are formed in the reaction chamber, the third through hole is connected to the first through hole to form a first introduction channel, and the fourth through hole is connected to the second through hole to form a second introduction channel; the first components protrude outside the reaction chamber through the first introduction channel, the second component protrudes outside the reaction chamber through the second introduction channel.

In some embodiments of the present disclosure, the lower electrode mechanism further includes a second shielding module, the second shielding module is disposed outside the reaction chamber, and forms a second shielding chamber that closes an outer end of the first introduction channel connected to the outside.

In some embodiments of the present disclosure, the chamber body of the lower electrode chamber is connected to a sidewall of the reaction chamber, the third through hole and the fourth through hole are formed on the sidewall of the reaction chamber.

In some embodiments of the present disclosure, a fifth through hole is disposed on a sidewall of the reaction chamber, a side cover is disposed on an outer side of the fifth through hole, the chamber body of the lower electrode chamber is connected to the side cover, and the third through hole and the fourth through hole are formed in the side cover; a horizontal rail is disposed at a bottom of the reaction chamber, the side cover is connected to the horizontal rail; and the side cover can move to the outside of the reaction chamber to allow the lower electrode mechanism to move out of the reaction chamber in one piece.

BRIEF DESCRIPTION OF THE DRAWINGS

The accompanying drawings are included to provide a further understanding of the present disclosure and constitute a part of the specification. The accompanying drawings are used to explain the present disclosure in conjunction with the following specific embodiments, but are not to be construed as a limitation of the present disclosure. In the accompanying drawings.

DETAILED DESCRIPTION OF THE EMBODIMENTS

Figure 1A:
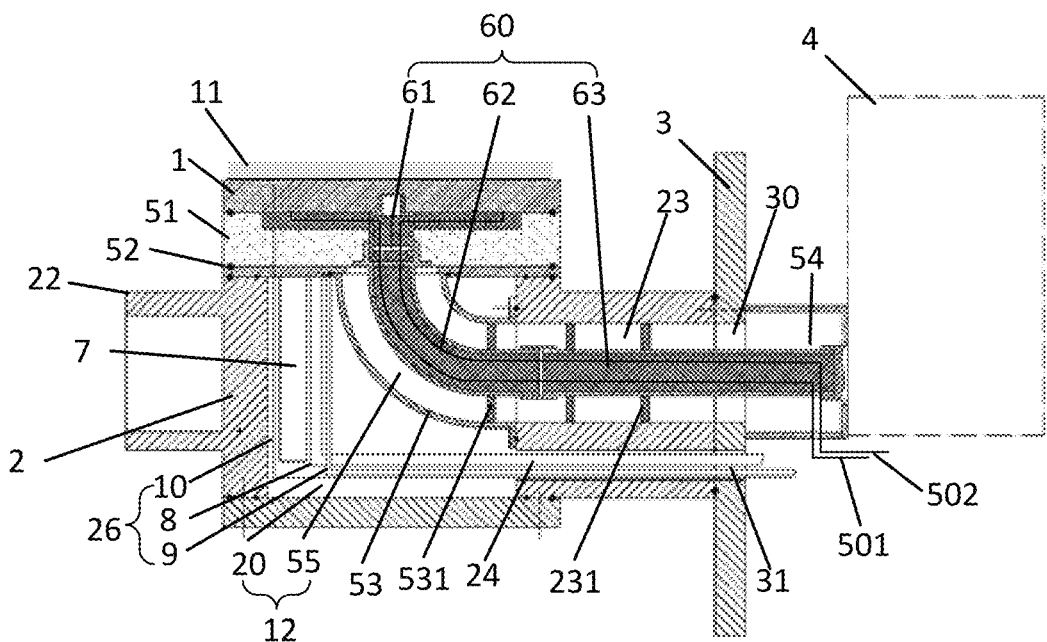
FIG. 1A is a cross-sectional view of a lower electrode mechanism according to an embodiment of the present disclosure.

The present disclosure provides a lower electrode mechanism including a base for carrying a workpiece to be processed, and a lower electrode chamber disposed under the base. The electrode chamber includes an electromagnetic shielding space and a non-electromagnetic shielding space that are isolated from each other to prevent a first component in the electromagnetic shielding space from being interfered by a second component in the non-electromagnetic shielding space. Therefore, not only the effect on uniformity of the electric field due to the radio frequency interference may be prevented, the radio frequency leakage may be reduced by using the electromagnetic shielding space, thereby improving the radio frequency stability. In addition, the electromagnetic shielding space and the non-electromagnetic shielding space are respectively connected to the outside through a first through hole and a second through hole penetrating a lower electrode chamber body. Further, the first component may be introduced into the electromagnetic shielding space through the first through hole, and the second component may be introduced into the non-electromagnetic shielding space through the second through hole.

In order to make the objectives, technical solutions, and advantages of the present disclosure more clear, the technical solutions in the embodiments of the present disclosure will be described below with reference to the drawings. It will be appreciated that the described embodiments are some rather than all of the embodiments of the present disclosure. Other embodiments conceived by those having ordinary skills in the art on the basis of the described embodiments without inventive efforts should fall within the scope of the present disclosure.

The structure of the lower electrode mechanism is described in detail below. More specifically, in conjunction with FIG. 1A to FIG. 10, the lower electrode mechanism according to an embodiment of the present disclosure is disposed in a reaction chamber, and includes a base 1 for carrying a workpiece to be processed 11, and a lower electrode chamber 12 disposed under base 1. The lower electrode chamber 12 includes an electromagnetic shielding space 55 and a non-electromagnetic shielding space 20 that are isolated from each other. By forming the lower electrode chamber 12 into the electromagnetic shielding space 55 and the non-electromagnetic shielding space 20 isolate from each other, a first component 25 in the electromagnetic shielding space 55 may be prevented from being interfered by a second component 26 in the non-electromagnetic shielding space 20.

More specifically, a chamber 2 may include a chamber body. A first extension portion 21 may be formed on one side of the chamber body. The first extension portion 21 may extend to an inner wall of a sidewall 3 of the reaction chamber, where the lower electrode mechanism may be disposed. Further, a first through hole 23 and a second through hole 24 may be horizontally disposed and formed in the first extension portion 21.

Figure 1B:
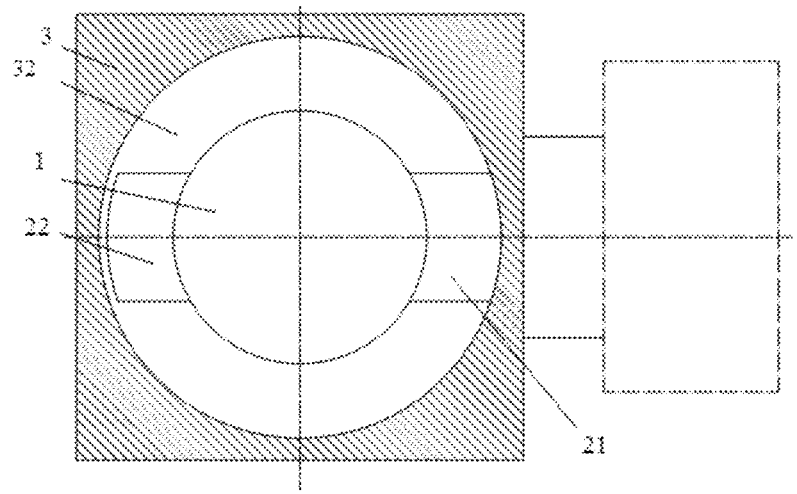
FIG. 1B is a top plan view of the lower electrode mechanism according to an embodiment of the present disclosure.

As shown in FIG. 1B, an orthographic projection shape of the inner wall of the sidewall 3 of the reaction chamber in which the lower electrode mechanism may be located is circular in an axial direction of the reaction chamber. That is, an internal space 32 of the reaction chamber may be a symmetrical structure, and since the first extension portion 21 described above may be a convex with respect to base 1, the overall structure of the lower electrode mechanism may be asymmetrical. As such, the uniformity of the airflow field in the internal space 32 of the reaction chamber in which the lower electrode mechanism may be located may be affected, thereby affecting the process uniformity. Therefore, in one embodiment, as shown in FIG. 1A, a second extension portion 22 may be arranged on the other side of the chamber body opposite to the first extension portion 21. The second extension portion 22 may be symmetrical with the first extension portion 21 with respect to a center line 111 of base 1 in the radial direction, such that the uniformity of the airflow field of the internal space 32 of the reaction chamber in which the lower electrode mechanism may be located may be ensured, thereby improving the process uniformity. It should be easy to understand that the size and outer shape of the second extension portion 22 may be identical to the size and outer shape of the first extension portion 21 described above, such that the overall structure of the lower electrode mechanism may be symmetrical.

Figure 2:
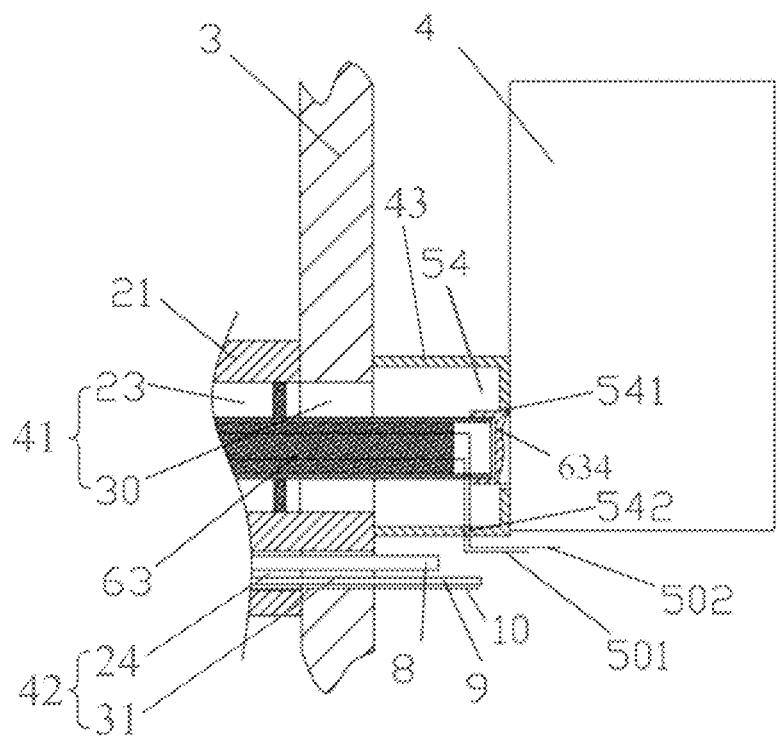
FIG. 2 is a cross-sectional view of a first shielding module employed according to an embodiment of the present disclosure.

Referring to FIG. 2, the first component 25 may be sequentially connected to a first component connector (not shown) in base 1 through the first through hole 23 and the electromagnetic shielding space 55; and the second component 26 may be sequentially connected to a second component connector (not shown) in base 1 through the second through hole 24 and the non-electromagnetic shielding space 20.

Figure 3:
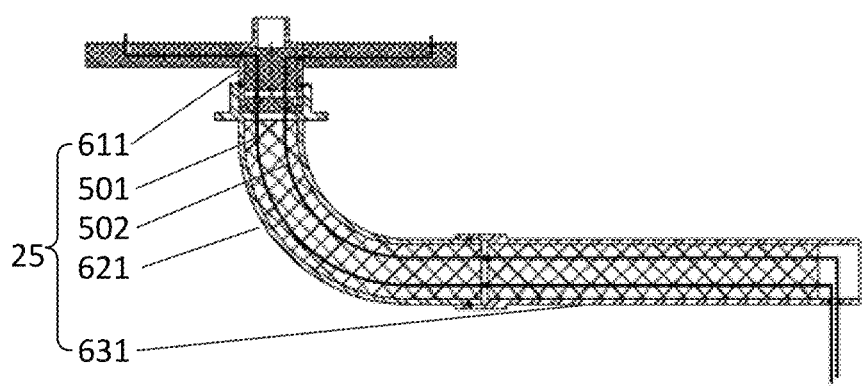
FIG. 3 is a cross-sectional view of a first component employed according to an embodiment of the present disclosure.

Referring to FIG. 3, in a practical application, base 1 usually includes a heating function. That is, a heating element may be arranged in base 1 to control the temperature of the workpiece to be processed 11. In this case, the first component 25 described above may need to include a heating wire 501. Further, an interface of the heating wire 501 may be disposed in base 1 for electrically connecting the heating element to an output end of the heating wire 501. An input end of the heating wire 501 may be electrically connected to an AC power source disposed outside the reaction chamber where the lower electrode mechanism may be disposed to provide an alternating current for heating. If the base is an electrostatic chuck, a DC electrode for generating electrostatic attraction between the workpiece to be processed 11 may be disposed inside the electrostatic chuck. In this case, the first component 25 described above may need to further include an electrostatic adsorption wire 502. Further, an interface of the electrostatic adsorption wire 502 may be disposed in base 1 for electrically connecting the DC electrode to an output end of the electrostatic adsorption wire 502. An input end of the electrostatic adsorption wire 502 may be electrically connected to a DC power supply disposed outside the reaction chamber where the lower electrode mechanism may be disposed to provide a direct current for electrostatic adsorption. In addition, if it is necessary to load the RF bias to base 1, the first component may further include a RF conductive component. Further, an interface of the RF conductive component may be disposed in base 1 for electrically connecting base 1 to an output end of the RF conductive component. The RF conductive component may be electrically connected to a matching device and a RF power supply disposed outside the reaction chamber where the lower electrode mechanism may be disposed to provide a radio frequency current. It can be seen from the above description, the first component 25 usually may include a heating wire 501, an electrostatic adsorption wire 502, and a RF conductive component.

Base 1 may further include a back-blowing channel for introducing a cooling air into a gap between base 1 and the workpiece to be processed 11, and a cooling channel for cooling base 1. In this case, the second component 26 described above may include a back-blowing duct 8, and an interface of the back-blowing duct 8 may be disposed in base 1 for connecting the back-blowing channel to an output end of the back-blowing duct 8. An input end of the back-blowing duct 8 may be connected to a back-blow air supply disposed outside the reaction chamber where the lower electrode mechanism may be disposed to provide a cooling air. Base 1 may further include a cooling channel for cooling base 1. In this case, the second component 26 described above may include a cooling duct 9, and an interface of the cooling duct 9 may be disposed in base 1 for connecting the cooling channel to an output end of the cooling duct 9. An input end of the cooling duct 9 may be connected to a cooling water supply disposed outside the reaction chamber where the lower electrode mechanism may be disposed to provide cooling water. In addition, a temperature sensor may be disposed in base 1. In this case, the second component 26 described above may include a wire 10 of the temperature sensor, and an interface of the wire 10 may be disposed in base 1 for connecting the temperature sensor to an output end of the wire 10. An input end of the wire 10 may be connected to a control unit disposed outside the reaction chamber where the lower electrode mechanism may be disposed for outputting detection data to the control unit. Further, a thimble mechanism 7 may be disposed in the non-electromagnetic shielding space 20 for lifting/lowering the workpiece to be processed 11 on base 1 while handling the wafer. It can be seen from the above description, the second component 26 usually may include a back-blowing duct 8, a cooling duct 9, and a wire 10.

The forming of the structure of the electromagnetic shielding space 55 and the non-electromagnetic shielding space 20 described above will be described in detail below. More specifically, in the present embodiment, base 1 may include a base body and an insulating disk 51 that are disposed in the order from top to bottom. The insulating disk 51 may be disposed on top of the lower electrode chamber 12 for carrying the base body and electrically insulating the base body from the chamber 2 of the lower electrode chamber. The insulating disk 51 may have a disk shape, and the insulating disk 51 may be made of an insulating material such as aluminum oxide. In some embodiments, the thickness of the insulating disk 51 may range from 60 mm to 300 mm to ensure good insulation between the base body, the chamber 2 of the lower electrode chamber, and the components inside the chamber 2 of the lower electrode chamber, and to stabilize the potential of the base body. In addition, in some embodiments, the portions of the back-blowing duct 8, the cooling duct 9, and the thimble mechanism 7 connected to the base body may be made of an insulating material to electrically insulate the back-blowing duct 8, the cooling duct 9, and the thimble mechanism 7 from the base body.

The lower electrode mechanism may further include a first shielding module. The first shielding module may be disposed between an inner end of the first through hole 23 and base 1, and located in the lower electrode chamber 12 to form a first electromagnetic shielding chamber. That is, the first electromagnetic shielding chamber may be the electromagnetic shielding space 55. The space outside the first electromagnetic shielding chamber in the lower electrode chamber 12 may be the non-electromagnetic shielding space 20.

In the present embodiment, the first shielding module described above may include a shielding sleeve 53 having an arc shape and disposed in the lower electrode chamber 12. Further, one end of the shielding sleeve 53 may be connected to an interface disk 52 disposed at the bottom of the insulating disk 51, and the other end of the shielding sleeve 53 may be communicating with a first introduction channel 41, thereby forming the first electromagnetic shielding chamber. By making the shielding sleeve in an arc shape, the space occupied by the shielding sleeve 53 in the lower electrode chamber 12 may be reduced, thereby facilitating the arrangement of the second component in the non-electromagnetic shielding space 20. In addition, in some embodiments, an elastic conductive wafer may be disposed at the joint of the shielding sleeve 53 and the interface disk 52, and the joint of the shielding sleeve 53 and an inner wall of the chamber 2 to enhance the grounding effect of the shielding sleeve 53 through the interface disk 52 and the chamber 2.

In the present embodiment, the lower electrode mechanism may further include an introduction assembly 60. The introduction assembly 60 may be used as a carrier for the first component 25 described above, and integrate all of the first components 25 and introduce them into the bottom of base 1, such that he introduction paths of the different first components may be the same, thereby improving the uniformity of the arrangement of the first components 25.

The specific structure of the introduction assembly 60 will be described in detail below. More specifically, as shown in FIG. 1A, the extending direction of the introduction assembly 60 may sequentially coincide with the axial direction of the first through hole 23 and the axial direction of the electromagnetic shielding space 55. For the ease of installation, the introduction assembly 60 may include a first introduction section 61, a second introduction section 62, and a third introduction section 63 that are sequentially connected. In particular, the first introduction section 61 may be embedded in the insulating disk 51; the second introduction section 62 may be disposed in the electromagnetic shielding space 55; and the third introduction section 63 may protrude through the first through hole 23 to the outside of the lower electrode mechanism.

Figure 4:
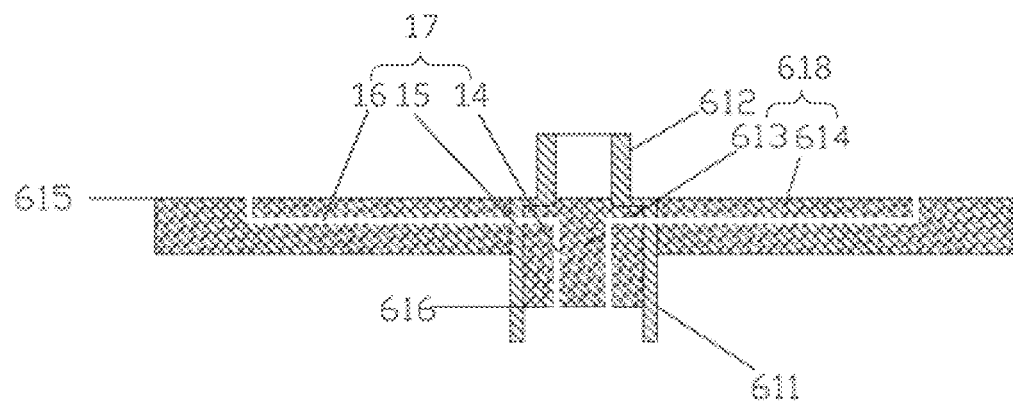
FIG. 4 is a cross-sectional view of a first introduction section of an introduction assembly employed according to an embodiment of the present disclosure.
Figure 5:
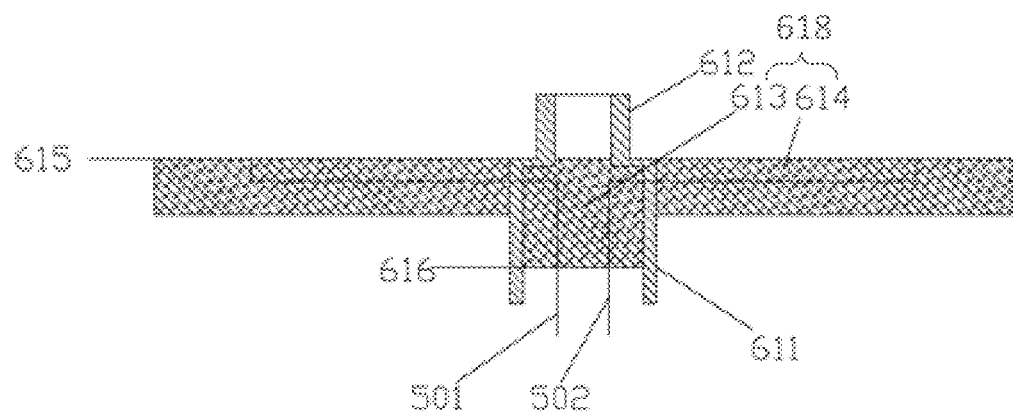
FIG. 5 is another cross-sectional view of the first introduction section of the introduction assembly employed according to an embodiment of the present disclosure.

In the present embodiment, as shown in FIG. 4 and FIG. 5, the first introduction section 61 includes a radio frequency sleeve 611 and a first insulator 618. The radio frequency sleeve 611 may be used as the RF conductive component described above to conduct radio frequency power. An upper end of the radio frequency sleeve 611 may be electrically connected to the base body, and a lower end of the radio frequency sleeve 611 may extend to a lower surface of the insulating disk 51 and connect to the second introduction section 62. In the present embodiment, the radio frequency sleeve 611 may be a vertically disposed straight cylinder, and a connection barrel 612 having a smaller diameter than the straight cylinder may be formed at an upper end of the straight cylinder. Correspondingly, a groove may be formed on the lower surface of the base body to be used as an interface of the connection barrel 612, and the connection barrel 612 may be embedded in the groove, such that the radio frequency sleeve 611 may be in good electrical contact with the base body. In addition, a lower end of the straight cylinder may extend to the lower surface of the insulating disk 51 and connect to the second introduction section 62.

The first insulator 618 may be used as a carrier of the heating wire 501 and the electrostatic adsorption wire 502, and electrically insulate both the heating wire 501 and the electrostatic adsorption wire 502 from the radio frequency sleeve 611. The first insulator 618 may be disposed in the radio frequency sleeve 611, and the first insulator 618 may substantially fill the internal space of the radio frequency sleeve 611 to fix the heating wire 501 and the electrostatic adsorption wire 502 and insulate the heating wire 501 and the electrostatic adsorption wire 502 from the radio frequency sleeve 611 described above. More specifically, the first insulator 618 may include a center portion 613 embedded in the straight cylinder and an outer ring portion 614 disposed around the outer peripheral wall of the straight cylinder. A lower surface of the center portion 613 may be a lower contact surface 616, and an upper surface of the outer ring portion 614 may be an upper contact surface 615. The upper contact surface 615 may be in contact with the lower surface of the base body, and the lower contact surface 616 may be in contact with the second introduction section 62. In addition, a plurality of first conductive channels 17 may be formed in the first insulator 618. Each of the first conductive channels 17 may extend from the upper contact surface 615 to the lower contact surface 616, and the heating wire 501 and the electrostatic adsorption wire 502 may pass through the respective first conductive channels 17 in a one-to-one correspondence. A first channel 14 may be formed in the center portion 613, a second channel 15 may be formed in the cylindrical wall of the straight cylinder, and a third channel 16 may be formed in the outer ring portion 614. The first channel 14, the second channel 15, and the third channel 16 may be connected to form the first conductive channels 17.

In the present embodiment, the first conductive channels 17 may be arranged as follow. The heating wire 501 and the electrostatic adsorption wire 502 may extend vertically upward from the lower contact surface 616 into the center portion 613, pass through the cylinder wall of the straight cylinder in the horizontal direction and extend into the outer ring portion 614, and finally extend vertically upward from the upper contact surface 615 and connect to a corresponding in the base body. In some embodiments, corresponding to the first components 25 having different functions, the plurality of the first conductive channels 17 may be layered in the vertical direction in the first insulator 618 to prevent different first components 25 from interfering with each other. Further, the heights of the plurality of the first conductive channels 17 extending horizontally in the center portion 613 and the outer ring portion 614 may be different to achieve a layered arrangement. For example, for the heating wire 501 and the electrostatic adsorption wire 502, by using the layered arrangement, it may be possible to reduce the interference of the heating wire 501 that supplies the alternating current to the electrostatic adsorption wire 502 that supplies the direct current. In addition, based on difference of the supply voltages of the heating wire 501 and the electrostatic adsorption wire 502 (usually, the DC voltage maybe 2400V and the AC voltage may be 220V), the first conductive channel corresponding to the heating wire 501 may be disposed in a layer under the first conductive channel corresponding to the electrostatic adsorption wire 502. As such, the heating wire 501 may be closer to the grounding position to ensure that the heating wire 501 is sufficiently insulated from the ground. In addition, the arrangement of the plurality of conductive channels 17 shown in FIG. 4 may satisfy the arrangement shown in FIG. 9, where a plurality of heating wires 501 are symmetrically distributed around the axis of the center portion 613; there is at least one electrostatic adsorption wire 502, which is disposed inside the plurality of heating wires 501.

As a variant of the first introduction section 61 described above, as shown in FIG. 10, the first introduction section 61 includes a radio frequency sleeve 611 and a first insulator 618. In particular, the radio frequency sleeve 611 may be a cone, and the diameter of the upper end of the cone may be larger than the diameter of the lower end of the cone. That is, the shape of the cone may be similar to a bowl shape to accommodate the first insulator 618 therein. Further, an upper end 611a of the cone may be electrically conductive to the base body, and the upper end 611a of the cone may be embedded in the base body to achieve a good electrical contract of the cone with the base body. A lower end 611b of the cone may extend to the lower surface of the insulating disk 51 and connect to the second introduction section 62. The first insulator 618 may be embedded in the cone and conform to the shape of the cone, that is, also in the shape of a bowl to fix the heating wire 501 and the electrostatic adsorption wire 502, and to insulate the heating wire 501 and the electrostatic adsorption wire 502 from the radio frequency sleeve 611 described above. The structure and arrangement of the first conductive channels 17 disposed in the first insulator 618 are the same as the first conductive channels 17 described above, and are not described herein again.

Figure 6A:
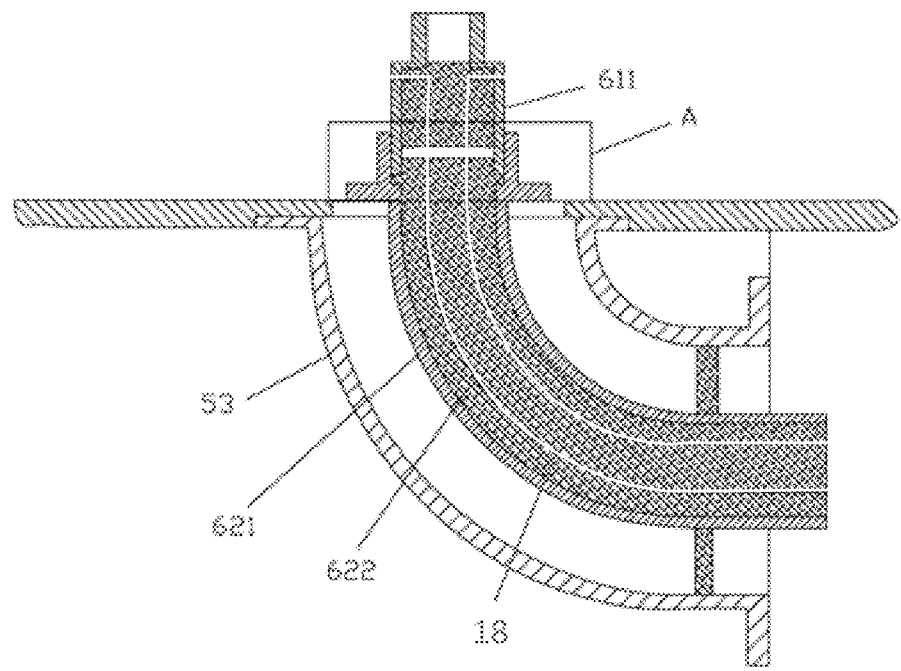
FIG. 6A is a cross-sectional view of a second introduction section of the introduction assembly employed according to an embodiment of the present disclosure.
Figure 6B:
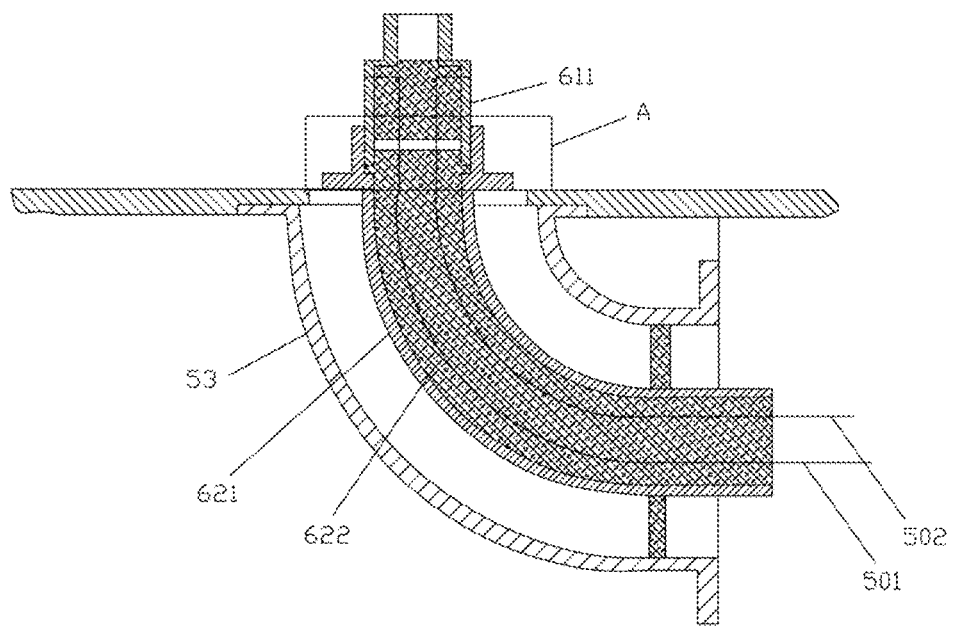
FIG. 6B is another cross-sectional view of the second introduction section of the introduction assembly employed according to an embodiment of the present disclosure.

As shown in FIG. 6A and FIG. 6B, the second introduction section 62 includes a first radio frequency conduit 621 and a second insulator 622. In particular, the first radio frequency conduit 621 may be used as a radio frequency conductive component, and an upper end of the first radio frequency conduit 621 may be connected to the lower end of the radio frequency sleeve 611. As shown in FIG. 6A and FIG. 6B, the upper end of the first radio frequency conduit 621 is sleeved on an outer peripheral wall of the lower end of the radio frequency sleeve 611, and the first radio frequency conduit 621 and the radio frequency sleeve 611 may be fixed connected by screws. Further, an elastic conductive wafer 624 may be disposed between an inner peripheral wall of the upper end of the first radio frequency conduit 621 and the outer peripheral wall of the lower end of the radio frequency sleeve 611 for enhancing the electrical contact between the first radio frequency conduit 621 and the radio frequency sleeve 611 to achieve good electrical conductivity. The radio frequency conduit 621 may have an arc shape, and the lower end of the radio frequency conduit 621 may extend along an arcuate axis of the shielding sleeve 53 and connect to the third introduction section 63.

The second insulator 622 may be filled in the first radio frequency conduit 621, and similar to the first insulator described above, the second insulator 622 may substantially fill the internal space of the first radio frequency conduit 621 to achieve fixation of the heating wire 501 and the electrostatic adsorption wire 502 while electrically insulating the heating wire 501 and the electrostatic adsorption wire 502 from the first radio frequency conduit 621. Further, a first end surface of the second insulator 622 may be opposite to the first introduction section 61, and a second end surface of the second insulator 622 may be opposite to the third introduction section 63. Furthermore, a plurality of second conductive channels 18 may be formed in the second insulator 622, and the second conductive channels 18 may be disposed along an axis of the first radio frequency conduit 621. One end of the second conductive channels 18 may extend to the first end surface of the second insulator 622, and the other end of the second conductive channels 18 may extend from the first end surface to the second end surface. The heating wire 501 and the electrostatic adsorption wire 502 may pass through the respective second conductive channels 18 in a one-to-one correspondence, and the arrangement of the plurality of second conductive channels 18 may identical to the arrangement of the first conductive channels shown in FIG. 9.

Figure 6C:
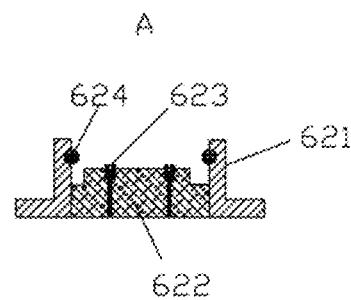
FIG. 6C is an enlarged view of an area A in FIG. 6A.

In addition, the manner of connecting the portion of the heating wire 501 and the electrostatic adsorption wire 502 in the second conductive channel to the portion in the first conductive channel may be as follow. As shown in FIG. 6C, a plurality of tabs 623 may be disposed at the ends of the portion of the heating wire 501 and the electrostatic adsorption wire 502 in the second conductive channel. Correspondingly, a plurality of sockets (not shown) may be disposed at the ends of the portion of the heating wire 501 and the electrostatic adsorption wire 502 in the second conductive channel. The portion of the heating wire 501 and the electrostatic adsorption wire 502 in the second conductive channel and the portion of the heating wire 501 and the electrostatic adsorption wire 502 in the second conductive channel may be electrically conducted to each other by inserting the tabs 623 into the sockets.

In some embodiments, the inner diameter of the shielding sleeve 53 may be 2-6 times of the outer diameter of the second introduction section 62, such that the electromagnetic shielding space 55 may be wide enough to prevent the shielding sleeve 53 from interfering with the radio frequency conductive component (i.e., the first radio frequency conduit 621) in the second introduction section 62. In addition, in some embodiments, the outer diameter of the second introduction section may range from 15 mm to 50 mm to provide sufficient space to arrange the first components 25 with different functions. Further, the outer diameter of the third introduction section 63 may be the same as the outer diameter of the second introduction section 62.

Figure 7:
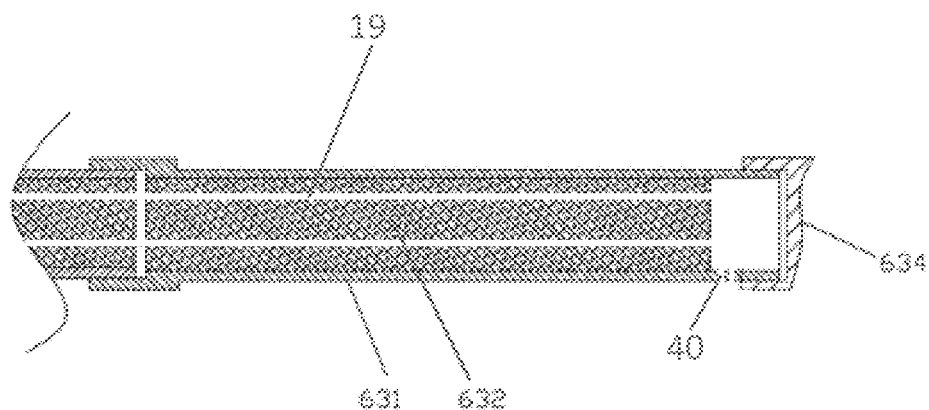
FIG. 7 is a cross-sectional view of a third introduction section of the introduction assembly employed according to an embodiment of the present disclosure.
Figure 8:
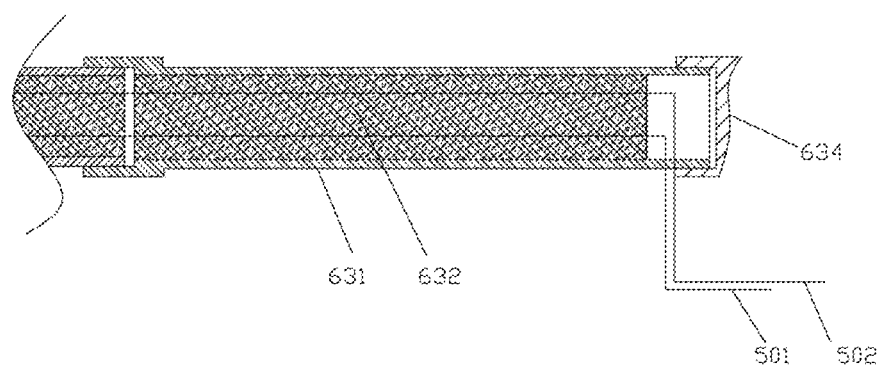
FIG. 8 is another cross-sectional view of the third introduction section of the introduction assembly employed according to an embodiment of the present disclosure.
Figure 9:
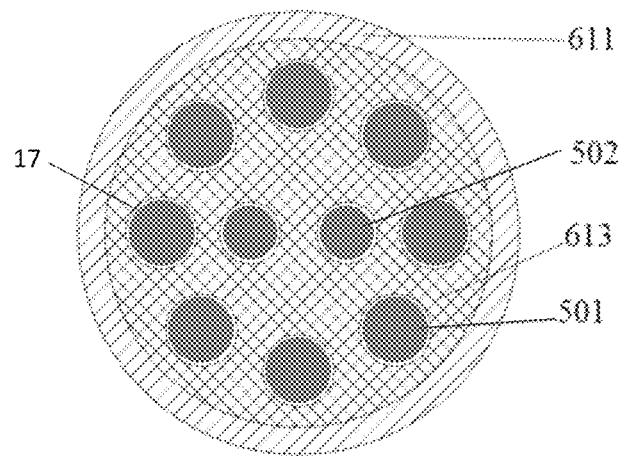
FIG. 9 is a radial-sectional view of the first introduction section.
Figure 10:
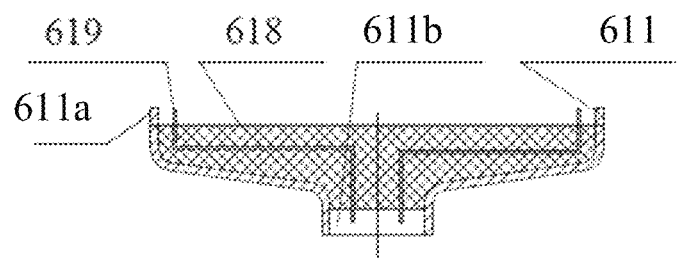
FIG. 10 is another cross-sectional view of the first introduction section of the introduction assembly employed according to an embodiment of the present disclosure.

As shown in FIG. 7 and FIG. 8, the third introduction section 63 includes a second radio frequency conduit 631 and a third insulator 632. In particular, the second radio frequency conduit 631 may be used as a radio frequency conductive component, and one end of the second radio frequency conduit 631 may be connected to the second introduction section 62. The specific connection manner may be the same as the connection of the upper end of the first radio frequency conduit 621 to the lower end of the radio frequency sleeve 611 shown in FIG. 6C. Further, the other end of the second radio frequency conduit 631 may extend horizontally along the axis of the first through hole 23 to the outside of the lower electrode mechanism.

The third insulator 632 may be disposed in the second radio frequency conduit 631, and the third insulator 632 may substantially fill the inner fill the internal space of the second radio frequency conduit 631 to achieve fixation of the heating wire 501 and the electrostatic adsorption wire 502 while electrically insulating the heating wire 501 and the electrostatic adsorption wire 502 from the second radio frequency conduit 631. A first end surface of the third insulator 632 may be opposite to the second introduction section 62, that is, opposite to the second end surface of the second insulator 622 (i.e., the end facing the second through hole 24). Further, a plurality of third conductive channels 19 may be formed in the third insulator 632. Each of the third conductive channels 19 may be disposed along an axis of the second radio frequency conduit 631, and the third conductive channels 19 may extend from the first end surface of the third insulator 632 to a second end face of the third insulator 632. The heating wire 501 and the electrostatic adsorption wire 502 may pass through the respective third conductive channels 19 in a one-to-one correspondence, and protrude from the second end surface of the third insulator 632. In addition, the arrangement of the plurality of third conductive channels 19 may identical to the arrangement of the first conductive channels shown in FIG. 9.

In addition, as shown in FIG. 1A, the first shielding module further includes a first insulating ring 531. The first insulating ring 531 may be disposed on an inner wall of the shielding sleeve 53 for fixing the second introduction section 62 and isolating the second introduction section 62 from the shielding sleeve 53 to ensure the electrical insulation between the second introduction section 62 and the shielding sleeve 53. The first insulating ring 531 may be a closed ring body or provided by a plurality of separate bodies spaced around the inner wall of the shielding sleeve 53. Further, the second introduction section 62 may pass through the ring hole of the first insulating ring 531. In a practical application, there may be a plurality of first insulating rings 531, and the plurality of first insulating rings 531 may be spaced apart along the axial direction of the shielding sleeve 53.

Similar to the above, the first shielding module may further include a second insulating ring 231. The second insulating ring 231 may be disposed on an inner wall of the second through hole 24 for fixing the third introduction section 63 and isolating the third introduction section 63 from the first extension portion 21. More specifically, as shown in FIG. 1A, there are a plurality of second insulating rings 231 disposed along the axial direction of the second through hole 24, and the third introduction section 63 may sequentially pass through the ring holes of the plurality of second insulating rings 231. Of course, in a practical application, the number of the second insulating rings 231 may also be set to one based on the specific situation.

In summary, the present disclosure provides a lower electrode mechanism that forms an electromagnetic shielding space and a non-electromagnetic shielding space that may be isolated from each other to prevent a first component in the electromagnetic shielding space from being interfered by a second component in the non-electromagnetic shielding space. Therefore, not only the effect on uniformity of the electric field due to the radio frequency interference may be prevented, the radio frequency leakage may be reduced by using the electromagnetic shielding space, thereby improving the radio frequency stability.

Figure 11:
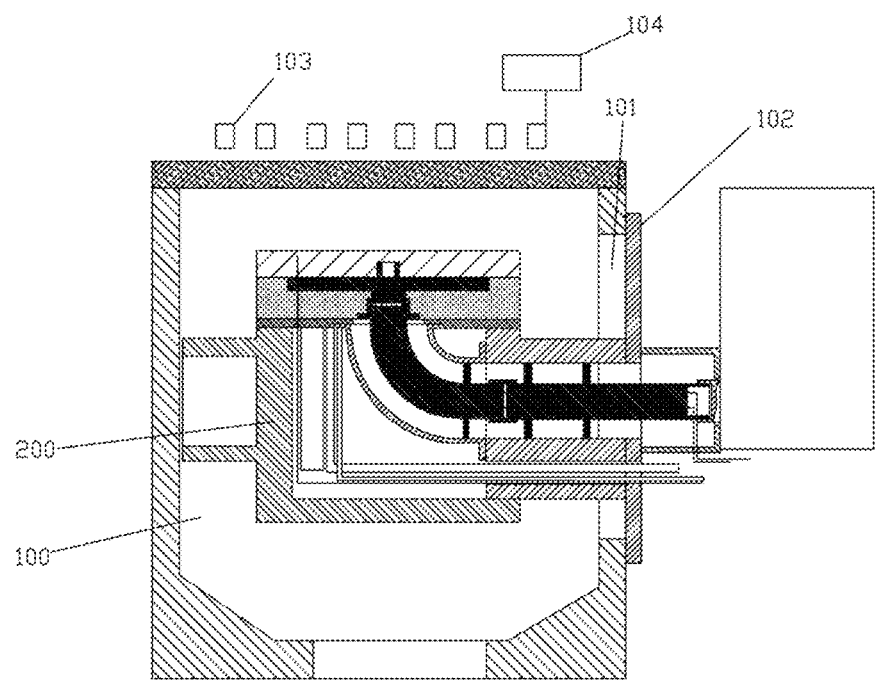
FIG. 11 is a cross-sectional view of a reaction chamber according to another embodiment of the present disclosure.
Figure 12:
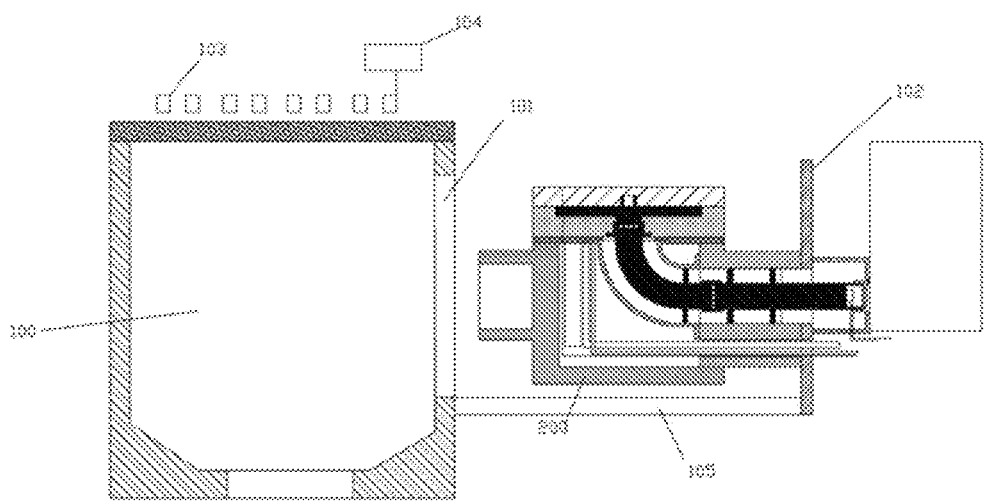
FIG. 12 is another cross-sectional view of the reaction chamber according to another embodiment of the present disclosure.

Another embodiment of the present disclosure further provides a reaction chamber. Referring to FIG. 2, FIG. 11, and FIG. 12, a radio frequency coil 103 is disposed above a reaction chamber 100 and electrically connected to a radio frequency power supply (not shown) through a matching unit 104, and a lower electrode mechanism 200 is disposed in the reaction chamber 100. In particular, the lower electrode mechanism may be the lower electrode mechanism provided in the previous embodiments of the present disclosure.

The sidewall 3 of the reaction chamber may be formed with a third through hole 30 and a fourth through hole 31 that are horizontally disposed. The third through hole 30 may communicate with the first through hole 23 of the lower electrode mechanism to form the first introduction channel 41, and the fourth through hole 31 may communicate with the second through hole 24 of the lower electrode mechanism to form the second introduction channel 42. The electromagnetic shielding space 55 and the non-electromagnetic shielding space 20 may respectively communicate with the outside through the first introduction channel 41 and the second introduction channel 42. The third introduction section 63 may project out of the reaction chamber through the first introduction channel 41, and the second component may project out through the second introduction channel 42 to the outside of the reaction chamber.

In the present embodiment, as shown in FIG. 2, the lower electrode mechanism further includes a second shielding module 43. The second shielding module 43 may be disposed outside the reaction chamber and form a second shielding chamber 54 that may close the outer end of the first introduction channel 41 in communication with the outside. More specifically, the second shielding chamber 54 may have a box shape and may be disposed outside the third through hole 30 of the reaction chamber sidewall 3, such that radio frequency leakage may be further reduced. In a practical application, the sidewall 3 of the reaction chamber may be grounded, and the chamber of the second shielding chamber may be grounded through the sidewall 3. In addition, in some embodiments, an elastic conductive wafer may be disposed at the joint of the sidewall 3 of the reaction chamber and the chamber of the second shielding chamber 54 to improve the grounding effect of the second shielding chamber 54.

The second shielding chamber 54 may include an opening to introduce the first component 25. The opening may include a radio frequency opening 541 for introducing a radio frequency conductive component, a wire opening 542 for introducing the heating wire 501 and the electrostatic adsorption wire 502. The second radio frequency conduit 631 extending from the first through hole 23 may be connected to a radio frequency supply disposed outside the second shielding chamber 54 through the radio frequency opening 541 on the second shielding chamber 54. The radio frequency supply may include a matcher 4 and a radio frequency power supply (not shown) that may be sequentially connected. The heating wire 501 and the electrostatic adsorption wire 502 extending from the second end surface of the third insulator 632 may be connected to the power supply disposed outside the second shielding chamber 54 through the wire opening 542.

In the present embodiment, a conductive pin 634 may be disposed at one end of the second end surface of the corresponding third insulator 632 of the second radio frequency conduit 631. The conductive pin 634 may be connected to the matcher 4 through the radio frequency opening 541, and the specific connection manner may be as follow: the radio frequency opening 541 may be disposed at a position opposite to the second end surface of the third insulator described above. In addition, a fourth channel 40 may be disposed on the outer peripheral wall of the second radio frequency conduit 631, and the heating wire 501 and the electrostatic adsorption wire 502 may sequentially extend through the fourth channel 40 and the wire opening 542, and connect to the corresponding power supply. By disposing the wire opening 542 described above on the outer peripheral wall of the second radio frequency conduit 631, it may be possible to prevent the heating wire 501 and the electrostatic adsorption wire 502 described above from interfering with the conductive pin 634.

In some embodiments, a through hole 101 may be disposed on the sidewall of the reaction chamber 100 for the lower electrode mechanism to pass through. A side cover 102 may be disposed on an outer side of the through hole 101 and connect with the chamber body of the lower electrode chamber 200. In addition, a horizontal rail 105 and a connecting member slidably connected to the horizontal rail 105 may be disposed at the bottom of the reaction chamber 100, and the side cover 102 may be connected to the horizontal rail 105. The side cover 102 may be movable toward the outside of the reaction chamber 100 to move the whole lower electrode mechanism out of the reaction chamber 100. When the lower electrode mechanism 200 needs to be repaired, the lower electrode mechanism may be completely removed from the reaction chamber 100 by manual or automatic control, thereby facilitating the maintenance of the lower electrode mechanism 200.

By employing the lower electrode mechanism provided by the embodiment of the present disclosure, the reaction chamber provided by the embodiment of the present disclosure may not only the effect on uniformity of the electric field due to the radio frequency interference may be prevented, the radio frequency leakage may be reduced, thereby improving the radio frequency stability.

The foregoing describes the embodiments of the present disclosure. It should be noted that the embodiments are only used to understand the present disclosure, and are not intended to limit the protection scope of the present disclosure. In addition, the feature of the embodiments, unless otherwise specified, the technical features that appear in the same or different embodiments can be used in combination when there is no conflict.

It should be noted that in the previous embodiments, the directional terminology used, such as "top," "bottom," "front," "back," etc., is used with reference to the orientation of the Figure(s) being described. The components of the present disclosure can be positioned in a number of different orientations. As such, the directional terminology is used for purposes of illustration and is in no way limiting the protection scope of the present disclosure. Throughout the drawings, the same elements are denoted by the same or similar reference numerals. Conventional structures or configurations may be omitted when it may cause confusion to the understanding of the present disclosure. Further, the shapes and dimensions of various components in the accompanying drawings do not reflect the true size and scale, and merely illustrate the content of the embodiments of the present disclosure.

In addition, the word "comprising" does not exclude elements or steps which are not recited in the claims. The word "a" or "an" does not exclude a plural of such elements.

The use of the ordinal numbers such as "first", "second", "third" and the like in the specification and claims for modifying corresponding elements does not mean that the elements has an ordinal number, or there is an order of one element and another element. The ordinal numbers are only used to enable a component having a certain name to be clearly distinguished from another component having the same name.

Similarly, it should be understood that various features of the present disclosure are sometimes grouped together into a single embodiment, a single figure, or description thereof in the above description of the example embodiments of the present disclosure, so as to simplify the present disclosure and facilitate the understanding of one or more of the aspects of the present disclosure. However, the method according to the present disclosure is not to be interpreted as reflecting the intention that the claimed disclosure requires more features than those specifically recited in the claims. Rather, as disclosed in the following claims, the disclosed aspects are less than all features of a single embodiment disclosed above. Therefore, the claims following the specific embodiments are hereby explicitly incorporated into the specific embodiments, and each of the claims per se is used as a separate embodiment of the present disclosure.

What is claimed is:

1. A lower electrode mechanism, comprising:
    a base for carrying a workpiece, wherein the base includes an insulating disk and a base body over the insulating disk;
    a lower electrode chamber disposed under the base and including an electromagnetic shielding space and a non-electromagnetic shielding space isolated from each other, wherein a chamber of the lower electrode chamber includes a first through hole and a second through hole, and the electromagnetic shielding space and the non-electromagnetic shielding space respectively connect to outside through the first through hole and the second through hole; and
    a first introduction section including a radio frequency sleeve and a first insulator, wherein:
        the radio frequency sleeve includes an upper end electrically connected to the base body and a lower end extending in the insulating disk, and
        the first insulator is disposed in the radio frequency sleeve and extends outward vertically above a first surface of the insulating disk, wherein a top surface of the first insulator, the upper end of the radio frequency sleeve and a second surface of the insulating disk are coplanar with each other.

2. The lower electrode mechanism according to claim 1, wherein the chamber of the lower electrode chamber includes a chamber body,
    a first extension portion being formed on one side of the chamber body, and the first through hole and the second through hole being horizontally disposed in the first extension portion.

3. The lower electrode mechanism according to claim 2, wherein a second extension portion is formed on another side of the chamber body opposite to the first extension portion, and the second extension is symmetrical with the first extension portion with respect to a center line of the base in a radial direction.

4. The lower electrode mechanism according to claim 1, wherein the lower electrode mechanism further includes a first shielding module disposed between an inner end of the first through hole connected to the lower electrode chamber and the base, and located in the lower electrode chamber to from a first electromagnetic shielding chamber, the first electromagnetic shielding chamber being the electromagnetic shielding space; and
    a space outside the first electromagnetic shielding chamber in the lower electrode chamber is the non-electromagnetic shielding space.

5. The lower electrode mechanism according to claim 4, wherein the first shielding module includes:
    a shielding sleeve having an arc shape, one end of the shielding sleeve being disposed under the base, and the other end of the shielding sleeve being connected to the first through hole to form the first electromagnetic shielding chamber.

6. The lower electrode mechanism according to claim 1, wherein
the lower electrode mechanism further includes a second introduction section, and a third introduction section,
the second introduction section being located in the electromagnetic shielding space; and the third introduction section protruding outside the lower electrode chamber through the first through hole.

7. The lower electrode mechanism according to claim 1, wherein
the lower end of the radio frequency sleeve of the first introduction section extends to a lower surface of the insulating disk and is connected to a second introduction section;
the first insulator of the first introduction section includes an upper contact surface being in contact with a lower surface of the base body, and a lower contact surface opposite to the second introduction section; and
a plurality of first conductive channels formed in the first insulator, each of the first conductive channels extending from the upper contact surface to the lower contact surface, and each of a plurality of first components passing through each of the first conductive channels.

8. The lower electrode mechanism according to claim 1, wherein
the radio frequency sleeve is a vertically arranged straight cylinder;
a lower end of the straight cylinder extends to the lower surface of the insulating disk and is connected to a second introduction section;
the first insulator includes a center portion embedded in the straight cylinder and an outer ring portion disposed around an outer peripheral wall of the straight cylinder and above the first surface of the insulating disk, a lower surface of the center portion is used as the lower contact surface and an upper surface of the outer ring portion is used as the upper contact surface;
a first channel is formed in the center portion, a second channel is formed in a cylindrical wall of the straight cylinder, and a third channel is formed in the outer ring portion, and the first channel, the second channel, and the third channel are connected to form the first conductive channel.

9. The lower electrode mechanism according to claim 8, wherein the plurality of first conductive channels are disposed in layers in a vertical direction in the first insulator.

10. The lower electrode mechanism according to claim 9, wherein the plurality of first conductive channels include:
one or more first conductive channels corresponding to a heating wire, and one or more first conductive channels corresponding to an electrostatic adsorption wire;
the conductive channels corresponding to the heating wire being located in a lower layer of the conductive channel corresponding to the electrostatic adsorption wire.

11. The lower electrode mechanism according to claim 1, wherein the radio frequency sleeve is a cone, and a diameter of an upper end of the cone is larger than a diameter of a lower end of the cone;
the upper end of the cone is electrically connected to the base body, and the lower end of the cone extends to the lower surface of the insulating disk and is connected to a second introduction section; and
the first insulator is embedded in the cone and conforms to the shape of the cone.

12. The lower electrode mechanism according to claim 6, wherein the second introduction section includes:

a first radio frequency conduit having an arc shape, an upper end of the first radio frequency conduit being connected to the first introduction section, and a lower end of the first radio frequency conduit being connected to the third introduction section;
a second insulator disposed in the first radio frequency conduit, a first end surface of the second insulator being opposite to the first introduction section, and a second end surface of the second insulator being opposite to the third introduction section; and
a plurality of second conductive channels formed in the second insulator, each of the second conductive channels being disposed along an axis of the first radio frequency conduit, and the second conductive channels extend from the first end surface to the second end surface;
each of a plurality of first components passing through each of the second conductive channels.

13. The lower electrode mechanism according to claim 6, wherein the third introduction section includes:
a second radio frequency conduit, one end of the second radio frequency conduit being connected to the second introduction section, and the other end of the second radio frequency conduit being extended horizontally along the axis of the first through hole to the outside of the lower electrode chamber;
a third insulator disposed in the second radio frequency conduit, and a first end surface of the third insulator being opposite to the second introduction section; and
a plurality of third conductive channels formed in the third insulator, each of the third conductive channels being disposed along an axis of the second radio frequency conduit, and the third conductive channels being extended from the first end surface of the third insulator to a second end surface of the third insulator;
each of a plurality of first components passing through each of the third conductive channels and protrudes from the second end surface of the third insulator.

14. The lower electrode mechanism according to claim 13, wherein a conductive pin is disposed on one end of the second radio frequency conduit corresponding to the second end surface of the third insulator; and
a fourth channel is disposed in in a sidewall of the second radio frequency conduit between the second end surface of the third insulator and the conductive pin, the plurality of first components extending from the second end surface of the third insulator extends outwardly from the fourth channel.

15. The lower electrode mechanism according to claim 1, further including first components disposed in the electromagnetic shielding space, wherein the first components include a plurality of heating wires and one or more electrostatic adsorption wires, in which,
the plurality of heating wires are symmetrically distributed around an axis of the electromagnetic shielding space; and
the one or more electrostatic adsorption wires are disposed inside the plurality of heating wires.

16. The lower electrode mechanism according to claim 6, wherein an inner diameter of the electromagnetic shielding space is 2 to 6 times of an outer diameter of the second introduction section and the outer diameter of the second introduction section ranges from 15 to 50 mm.

17. The lower electrode mechanism according to claim 6, wherein a thickness of the insulating disk ranges from 60 to 300 mm.

18. The lower electrode mechanism according to claim 6, wherein the lower electrode mechanism further includes:
- one or more first insulating rings, the third introduction section being fixed to an inner wall of the electromagnetic shielding space through the first insulating ring; and
- one or more second insulating ring, the third introduction section being fixed to an inner wall of the first through hole through the second insulating ring.

19. The lower electrode mechanism according to claim 1, further including
- a connection barrel over the radio frequency sleeve and embedded in a groove formed into a lower surface of the base body,
  - wherein the connection barrel has a diameter smaller than the radio frequency sleeve and electrically connects the radio frequency sleeve with the base body.

20. A reaction chamber, comprising:
a lower electrode mechanism disposed in the reaction chamber, the reaction chamber including:
- a base for carrying a workpiece, wherein the base includes an insulating disk and a base body over the insulating disk;
- a lower electrode chamber disposed under the base including an electromagnetic shielding space and a non-electromagnetic shielding space isolated from each other, wherein the lower electrode chamber includes a first through hole and a second through hole, and the electromagnetic shielding space and the non-electromagnetic shielding space respectively connect to an outside through the first through hole and the second through hole; and
- a first introduction section including a radio frequency sleeve and a first insulator, wherein:
  - the radio frequency sleeve includes an upper end electrically connected to the base body and a lower end extending in the insulating disk, and
  - the first insulator is disposed in the radio frequency sleeve and extends outward vertically above a first surface of the insulating disk, wherein a top surface of the first insulator, the upper end of the radio frequency sleeve and a second surface of the insulating disk are coplanar with each other.

21. The reaction chamber according to claim 20, wherein the lower electrode mechanism is connected to the reaction chamber, a third through hole and a fourth through hole are formed in the reaction chamber, the third through hole being connected to the first through hole to form a first introduction channel, and the fourth through hole being connected to the second through hole to form a second introduction channel; and
- the lower electrode mechanism further includes a plurality of first components protruding outside the reaction chamber through the first introduction channel, and a second component protruding outside the reaction chamber through the second introduction channel.

22. The reaction chamber according to claim 21, wherein the lower electrode mechanism further includes a second shielding module disposed outside the reaction chamber, and forms a second shielding chamber configured to close an outer end of the first introduction channel connected to the outside.

23. The reaction chamber according to claim 21, wherein the chamber body of the lower electrode chamber is connected to a sidewall of the reaction chamber, the third through hole and the fourth through hole being formed on the sidewall of the reaction chamber.

24. The reaction chamber according to claim 21, wherein a fifth through hole is disposed on a sidewall of the reaction chamber, and a side cover is disposed on an outer side of the fifth through hole, the chamber body of the lower electrode chamber being connected to the side cover, and the third through hole and the fourth through hole being formed in the side cover;
- a horizontal rail is disposed at a bottom of the reaction chamber, the side cover being connected to the horizontal rail; and
- the side cover is movable toward the outside of the reaction chamber to allow the lower electrode mechanism to move out of the reaction chamber in one piece.

\* \* \* \* \*